United States Patent

[11] 3,597,626

[72] Inventor John D. Heightley, Basking Ridge, N.J.
[21] Appl. No. 811,730
[22] Filed Apr. 1, 1969
[45] Patented Aug. 3, 1971
[73] Assignee Bell Telephone Laboratories Incorporated, Murray Hill, N.J.

[54] THRESHOLD LOGIC GATE

2 Claims, 4 Drawing Figs.

[52] U.S. Cl. .......... 307/203, 307/205, 307/211, 307/218, 307/235, 307/251, 307/304, 328/147
[51] Int. Cl. .......... H03k 19/22
[50] Field of Search .......... 307/203, 205, 211, 218, 235, 242, 251, 264, 304; 328/117, 116, 115, 146, 147, 150, 168, 172

[56] References Cited

UNITED STATES PATENTS

| | | | |
|---|---|---|---|
| 3,191,057 | 6/1965 | Feng | 307/218 |
| 3,201,703 | 8/1965 | Becker | 328/150 |
| 3,260,863 | 7/1966 | Burns et al. | 307/205 |
| 3,299,291 | 1/1967 | Warner, Jr et al. | 307/205 X |
| 3,445,680 | 5/1969 | Foster et al. | 307/218 X |
| 3,471,712 | 10/1969 | Tomozawa et al. | 307/205 |

*Primary Examiner*—Stanley T. Krawczewicz
*Attorneys*—R. J. Guenther and Kenneth B. Hamlin

ABSTRACT: The dichotomy presented in threshold logic gates by the desirability of a large gap or unit step near the threshold point, coupled with the desirability of a small overall signal swing on the threshold element for a large fan-in, is minimized by replacing the usual linear summing resistor with a nonlinear variable impedance element, such as a field effect transistor in one illustrative embodiment, having a low impedance below the gate threshold and a high impedance in the gap.

INVENTOR
J. D. HEIGHTLEY
BY D. E. Snedeker
ATTORNEY

THRESHOLD LOGIC GATE

BACKGROUND OF THE INVENTION

A threshold logic gate is basically a circuit having a single bivalued output and a plurality of bivalued inputs. The inputs may have the same weight or different weights, the gate providing one output value when the total input weights equal or exceed a predetermined threshold level and the other output value when the total input weights are less than the predetermined threshold level.

The advantages of threshold logic gates are becoming well known in many applications. Greater use of threshold logic gates has been limited principally by their slightly more complicated logic parameters and the problems attendant thereto. Ideally, a threshold logic gate should have a large gap (the unit weighted interval in which the threshold level lies) and should permit a large fan-in (the sum of the input weights). However, at the same time it is desirable that the overall signal swing on the threshold element be relatively small to achieve high speed operation and low power dissipation. This dichotomy has usually been comprised in the prior art by circuitry providing a small swing at the sacrifice of a small gap and a relatively small fan-in with resulting design complexity and sensitivity problems.

SUMMARY OF THE INVENTION

It is accordingly an object of this invention to provide a new and improved threshold logic gate arrangement which substantially minimizes the problems associated with known arrangements.

In particular, it is an object of this invention to provide an improved threshold logic gate having a large gap with a small overall signal swing for a large fan-in, thereby providing good sensitivity without sacrificing speed and without increasing power dissipation.

According to a feature of my invention the above and other objects are attained in a simple and economical manner in an illustrative embodiment of a threshold logic gate comprising a threshold circuit and an input signal combining circuit including a nonlinear impedance element. The nonlinear impedance replaces the usual linear summing resistor in the input signal combining circuit and provides a low impedance below the gate threshold level and a high impedance in the gap. The low impedance below the gate threshold level permits a large fan-in with a small overall signal swing on the threshold circuit, providing the gate with high speed operation and low power dissipation. At the same time the high impedance presented in the gap provides the gate with a large gap, thereby reducing the sensitivity requirements on the threshold circuit.

In accordance with an important aspect of one illustrative embodiment of my invention, each input comprises a simple field effect transistor current source and the nonlinear impedance element comprises a field effect transistor arrangement. This provides a threshold logic gate advantageously suited to integrated circuit manufacturing techniques.

BRIEF DESCRIPTION OF THE DRAWING

The above and other objects and features of the invention may be fully apprehended from the following detailed description and the accompanying drawing in which.

DETAILED DESCRIPTION

Figure 1:
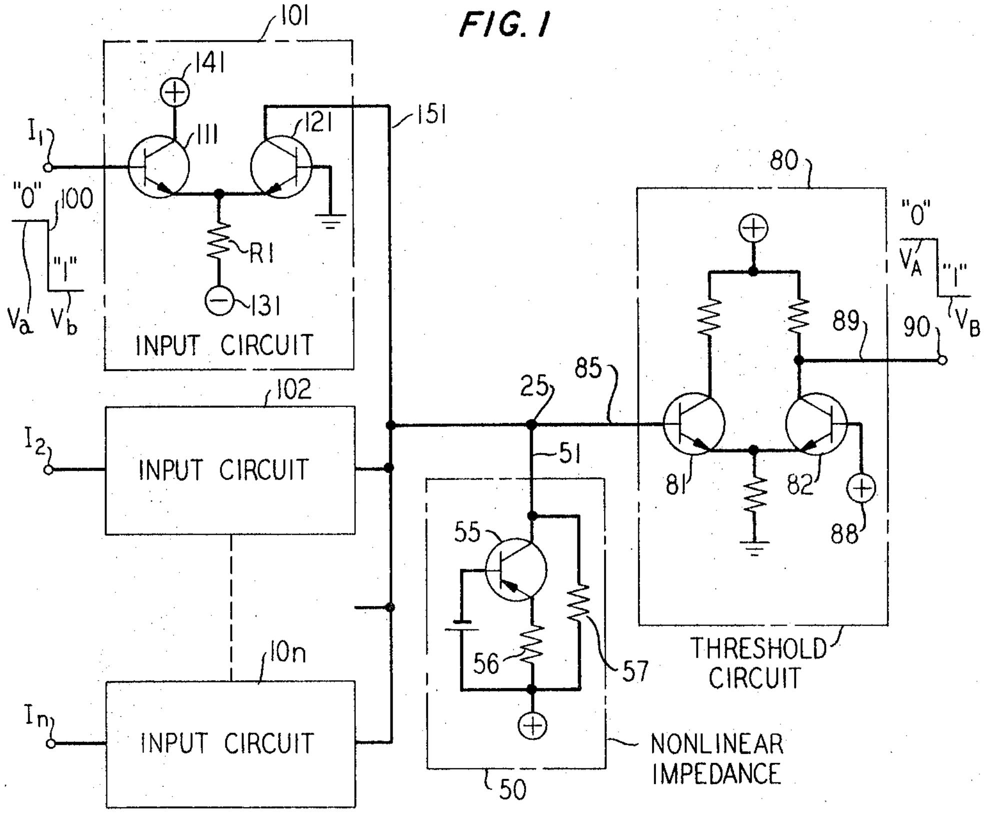
FIG. 1 is an illustrative embodiment of a threshold logic gate in accordance with the principles of my invention.

In FIG. 1 of the drawing an illustrative embodiment of a threshold logic gate according to my invention is shown comprising a plurality of input terminals $I_1$ through $I_n$, input circuits 101 through **10*n*, nonlinear variable impedance 50, threshold circuit 80 and output terminal 90. Bivalued input signals 100 applied to terminals $I_1$ through $I_n$ are combined by input circuits 101 through 10*n* and nonlinear impedance 50 to provide a signal at combining point 25 which is compared with a threshold level predetermined by threshold circuit 80. If the signal at point 25 equals or exceeds (in the negative direction for the illustrative embodiment) the predetermined gate threshold level $V_T$, an output signal of one value, such as signal $V_B$, is generated at output terminal 90. For the purposes of description it will be assumed herein that the threshold logic gate in FIG. 1 is a 7**-out-of-*n* gate, thus providing an output signal of the one value at terminal 90 when the total input signal units or weights equal or exceed 7. If the input signal units or weights total less than 7, an output signal of the other value, such as signal $V_A$, is provided at terminal 90.

Input circuits 101 through **10*n* illustratively comprise individual transistor current sources, such as shown in detail for input circuit 101. However, input circuits 101 through 10*n* may alternatively comprise capacitive inputs, resistor inputs, resistor-diode inputs, or other input arrangements well known in the threshold logic art. In operation, the bivalued input signals 100 applied to input terminals $I_1$ through $I_n$ are extended by respective input circuits 101 through 10*n* to combining point 25. The signals applied to point 25 in this manner may have the same weight or different weights as determined by the respective input signal magnitudes, or by the respective input circuits. For example, the input signal magnitudes may be identical with different weights being determined by the relative magnitudes of respective emitter resistors in input circuits 101 through 10*n*, such as resistor R1 in input circuit 101. However, let it be assumed herein to facilitate description that each input signal is identical, having one signal value $V_a$ and the other signal value $V_b$, and further, that each input signal of value $V_b$ extended to point 25 has the same weight, referred to herein as one input signal unit. Thus, if $Y$ is the output signal at terminal 90**, $$Y=V_B \text{ if} \sum_{i=1}^{n} i \geq 7 \text{ input signal units} \quad (1)$$

$$Y=V_A \text{ if} \sum_{i=1}^{n} i \leq 6 \text{ input signal units} \quad (2)$$

where the predetermined threshold level is 7 units and the gap lies between 6 and 7 units.

The current source input circuit illustratively depicted in input circuit 101 comprises a pair of like conductivity type transistors 111 and 121 having their emitters connected in common through resistor R1 to source 131. The base of transistor 111 is connected to input terminal $I_1$ and the collector is connected to potential source 141. The base of transistor 121 is connected to a reference potential, such as ground potential, and the collector thereof is connected over lead 151 to combining point 25. When an input signal having value $V_a$, corresponding for example to binary "0", is applied to input terminal $I_1$, transistor 111 is in a conducting state and transistor 121 is in a nonconducting state with essentially no current flowing over lead 151 to point 25. Application of an input signal to input terminal $I_1$ of value $V_b$, corresponding for example to a binary "1" or one input signal unit, switches transistor 111 to a nonconducting state. Transistor 121 is at the same time switched to a conducting state, causing a predetermined unit of current to flow over lead 151 to point 25, the magnitude thereof being determined principally by source 131 and resistor R1.

The combined input signal units of current extended in this manner to point 25 from input circuits 101 through **10*n* are directed over lead 51 to nonlinear impedance 50, illustratively comprising transistor 55 and resistors 56 and 57. Nonlinear impedance 50 functions in accordance with the principles of my invention to provide a low impedance below the gate threshold level and a high impedance in the gap. A typical voltage-current characteristic for nonlinear impedance 50 is depicted by waveform 201 in FIG. 2. Below the gate threshold level current flow is through resistors 56 and 57 in parallel, transistor 55 being in a saturated state. As the current increases, and thus the voltage at point 25 decreases, such as due to additional input signals $V_b$ applied to input terminals $I_1$ through $I_n$, transistor 55 is switched to a nonsaturated, constant current state. Transistor 55, in switching to a constant current state, removes resistor 56 from its parallel connection with resistor 57, thereby increasing the impedance connected to point 25. The level of current at which nonlinear impedance 50 switches from a low impedance state to a high impedance state is selected so as to effect this impedance change in the gap for the gate, that is in the interval between six and seven input signal units of current for the illustrative embodiment being described herein. The impedance change preferably occurs at or near the beginning of the gap as shown illustratively in FIG. 2**.

Figure 2:
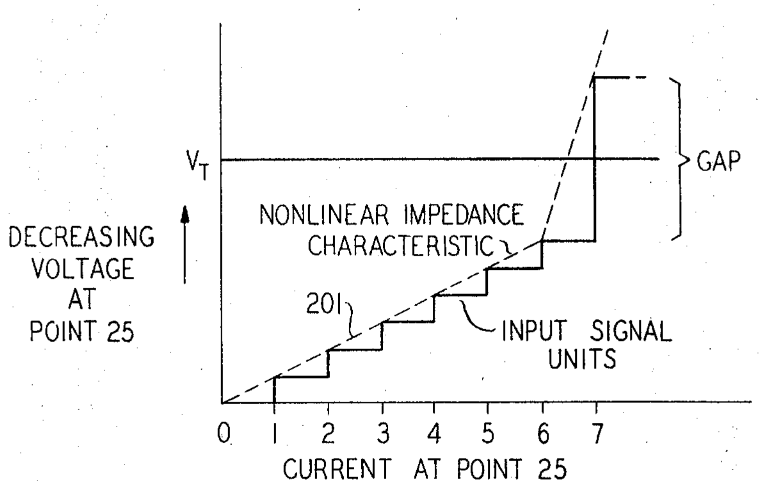
FIG. 2 depicts several waveforms useful in describing the operation of the illustrative embodiment of FIG. 1.

The predetermined threshold level for the gate, shown as level $V_T$ in FIG. 2, is determined by threshold circuit 80, illustratively shown in FIG. 1 as a conventional comparator circuit comprising transistors 81 and 82 and voltage comparison source 88. Alternative arrangements for threshold circuit 80 are well known in the art, such as those employing various other comparator circuits, breakdown diodes, magnetic cores, and the like. In the illustrative threshold circuit of FIG. 1 the base of transistor 81 is connected over lead 85 to point 25 and the base of transistor 82 is connected to voltage comparison source 88. The collector of transistor 82 is connected over lead 89 to output terminal 90. A conventional level shifting circuit may be connected in circuit with lead 89 to adjust the output voltage levels $V_A$ and $V_B$ to correspond to the input voltage levels $V_a$ and $V_b$, such as for driving subsequent circuits.

Transistor 82 is normally nonconducting and transistor 81 is in a conducting state, threshold circuit 80 providing output signal $V_A$ at output terminal 90. Transistor 81 remains conducting until the voltage level at point 25 reaches threshold level $V_T$, determined principally by source 88, at which point transistor 81 is switched to a nonconducting state and transistor 82 is switched to a conducting state to provide output signal $V_B$ at terminal 90.

Recapitulating briefly then, the input signal combining circuitry including nonlinear impedance 50 produces a voltage signal at point 25 which changes substantially incrementally at a first, low impedance rate for each input signal unit applied to one of terminals $I_1$ through $I_n$. At a predetermined total of input signal units, and thus voltage at point 25, nonlinear impedance 50 switches to a high impedance state producing a voltage signal at point 25 which thereafter changes at a second rate for each additional input signal unit, the second rate being substantially greater than the first rate.

The predetermined total of input signal units at which nonlinear impedance 50 switches impedance states is approximately one input signal unit less than that for the gate threshold, thereby providing the second rate of change for the voltage signal at point 25 in the gap for the gate and the first rate preceding the gap.

Figure 3:
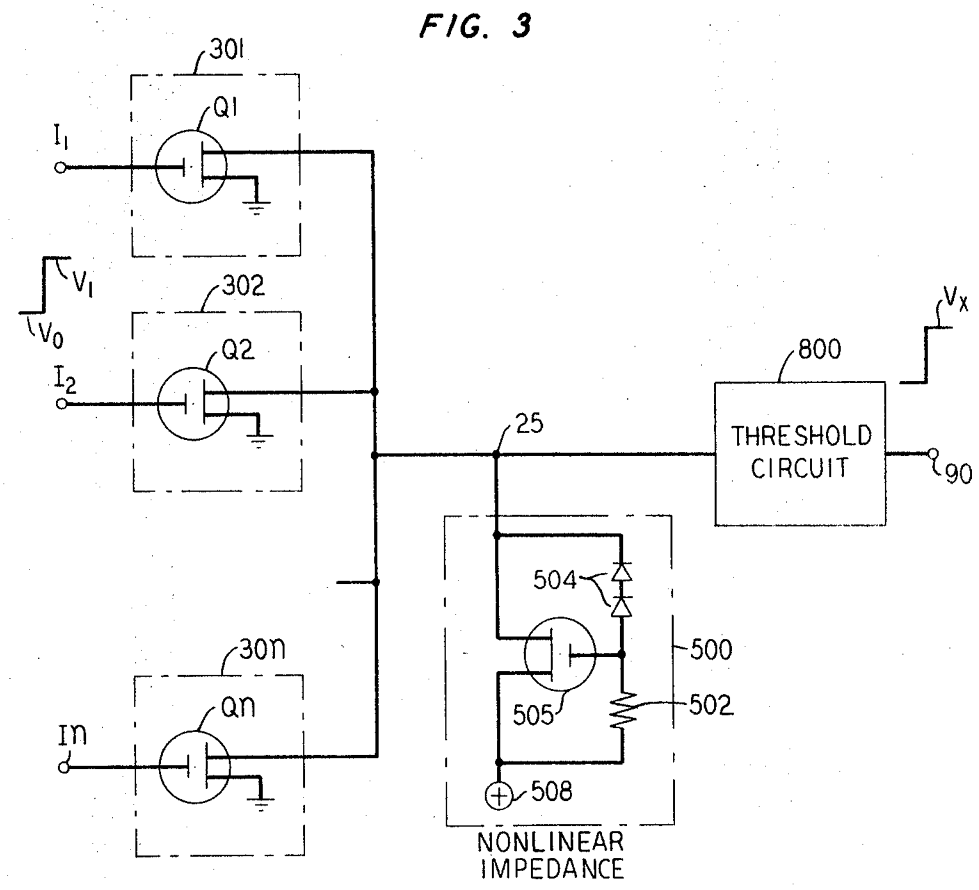
FIG. 3 shows another illustrative embodiment of a threshold logic rate according to my invention employing field effect transistors.

An alternative illustrative embodiment of a threshold logic gate according to my invention, advantageously suited to integrated circuit manufacturing techniques, is shown in FIG. 3 employing field effect transistors. As in the embodiment of FIG. 1, a plurality of input terminals $I_1$ through $I_n$, a combining point 25 and an output terminal 90 are shown, and current source inputs are depicted by way of example. Each of input circuits 301 through **30*n*** comprises a field effect transistor as a current source input. Thus, the individual gate leads of field effect transistors Q1 through Q*n* in input circuits 301 through **30*n* are connected to respective input terminals $I_1$ through $I_n$, the source leads thereof are connected to ground potential, and the drain leads to combining point 25**.

Figure 4:
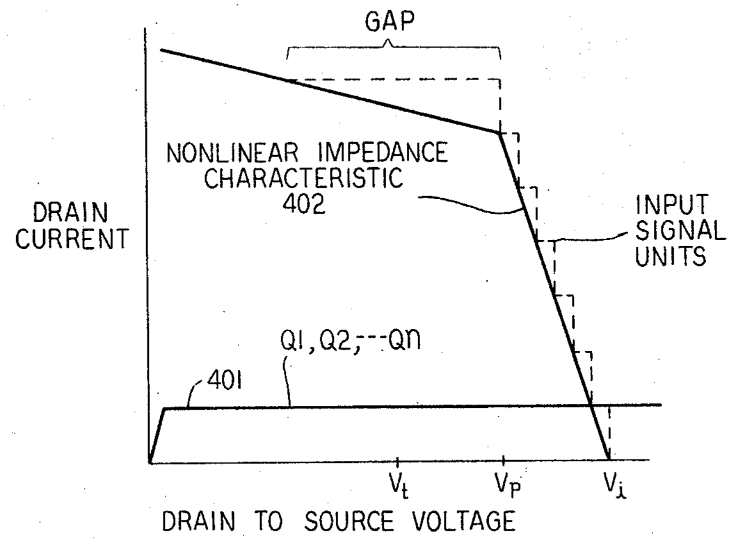
FIG. 4 depicts typical voltage-current characteristics for illustrative field effect transistors employed in the embodiment of FIG. 3.

A typical voltage-current characteristic for individual field effect transistors Q1 through Q*n*, assuming them to be substantially identical, is shown as waveform 401 in FIG. 4. When input signal $V_0$ is applied to one of input terminals $I_1$ through $I_n$ the corresponding input circuit field effect transistor is assumed to be reverse biased. On the other hand, when input signal $V_1$ is applied to an input terminal the corresponding input circuit field effect transistor is forward biased, causing a drain current flow $I_s$ to point 25.

Nonlinear impedance 500 connected to point 25 includes a field effect transistor 505 having resistor 502 connected between the gate and drain leads and having a pair of diodes 504 connected between the gate and source leads to provide a substantially constant gate-source voltage. The source lead of transistor 505 is connected to combining point 25 and the drain lead to source 508. Field effect transistor 505 provides nonlinear impedance 500 with a voltage-current characteristic of the type shown as waveform 402 in FIG. 4, which it will be noted is substantially similar to characteristic 201 provided by nonlinear impedance 50 in the embodiment of FIG. 1.

The voltage initially present at point 25, with no input signals applied to terminals $I_1$ through $I_n$, is determined by source 508 and is depicted as $V_i$ in FIG. 4. As the current flow to point 25 increases incrementally with each input signal $V_1$ applied to input terminals $I_1$ through $I_n$, the voltage at point 25 changes substantially incrementally in a decreasing direction in the illustrative embodiment until the "pinch-off" voltage $V_p$ of transistor 505 is reached. Beyond voltage $V_p$ transistor 505 presents a high impedance such that a subsequent input signal $V_1$ applied to one of input terminals $I_1$ through $I_n$ results in a voltage change at point 25 substantially larger than the previous incremental voltage changes, thereby providing the threshold logic gate embodiment of FIG. 3 with a large gap.

The predetermined threshold level for the gate is determined, of course, by threshold circuit 800 which may comprise circuitry substantially identical to that depicted illustratively for threshold circuit 80 in FIG. 1. When the voltage level at point 25 reaches the predetermined threshold level, such as voltage $V_t$ in FIG. 4, threshold circuit 800 provides output signal $V_r$ at output terminal 90.

What has been disclosed herein, therefore, is a simple, reliable and economical threshold logic gate arrangement having a large gap and permitting a large fan-in with a small overall signal swing on the threshold circuit.

What I claim is:

1. A threshold logic gate comprising a signal combining point; a plurality of input means for providing respective input signals to said point; threshold means connected to said point, said threshold means providing an output signal responsive to a first sum of said input signals; and variable impedance means connected to said point, said variable impedance means normally presenting a low impedance to said point and operative for presenting a high impedance to said point responsive to a second sum of said input signals, said second sum being less than said first sum, said variable impedance means comprising first and second impedance paths including first and second resistors respectively, and switching means operative in one of said paths for selectively connecting at least one of said first and second impedance paths to said point.

2. A threshold logic gate comprising a signal combining point; a plurality of input means for applying respective input signals to said point, said input means each including a current source comprising a field effect transistor; variable impedance means connected to said point for providing a low impedance when less than a predetermined total of input signal units is applied to said point and for providing a high impedance when greater than said predetermined total of input signal units is applied to said point; said variable impedance means comprising a field effect transistor and biasing means for providing a substantially constant voltage difference between the gate and source of said field effect transistor; and threshold means connected to said point for providing an output signal responsive to a total of input signal units greater than said predetermined total.